United States Patent
Wu

Patent Number: 6,154,039
Date of Patent: Nov. 28, 2000

[54] FUNCTIONAL OBIC ANALYSIS

[75] Inventor: Mingde Nevil Wu, San Jose, Calif.

[73] Assignee: LSI Logic Corporation, Milpitas, Calif.

[21] Appl. No.: 09/244,327

[22] Filed: Feb. 3, 1999

Related U.S. Application Data

[62] Division of application No. 08/701,476, Aug. 22, 1996, Pat. No. 5,905,381.

[51] Int. Cl.$^7$ .................................................. G01R 31/26
[52] U.S. Cl. ............................................ 324/752; 324/765
[58] Field of Search ................................. 324/752, 750, 324/751, 765, 501, 538; 714/736; 702/117

[56] References Cited

U.S. PATENT DOCUMENTS

| | | | |
|---|---|---|---|
| 4,494,069 | 1/1985 | Lin | 324/158 R |
| 4,544,887 | 10/1985 | Kamieniecki | 324/158 R |
| 4,733,176 | 3/1988 | Feuerbaum | 324/158 R |
| 4,736,159 | 4/1988 | Shiragasawa et al. | |
| 4,761,607 | 8/1988 | Shiragasawa et al. | 324/752 |
| 4,891,584 | 1/1990 | Kamieniecki et al. | 324/158 R |
| 4,968,932 | 11/1990 | Baba et al. | 324/158 D |
| 5,030,908 | 7/1991 | Miyoshi et al. | 324/158 R |
| 5,329,139 | 7/1994 | Sanada. | |
| 5,334,540 | 8/1994 | Ishii | 437/7 |
| 5,365,034 | 11/1994 | Kawamura et al. | |
| 5,422,498 | 6/1995 | Nikawa et al. | 257/48 |
| 5,430,305 | 7/1995 | Cole, Jr. et al. | 250/559.07 |
| 5,453,994 | 9/1995 | Kawamoto et al. | 371/25.1 |
| 5,493,236 | 2/1996 | Ishi et al. | 324/752 |
| 5,708,371 | 1/1998 | Koyama | 324/752 |
| 5,804,980 | 9/1998 | Nikawa | 324/752 |

OTHER PUBLICATIONS

Komoda et al., Detection of Open Contact Using Optical–Beam–Induced Current. Techniques, 8–1–9–94, Osaka, Japan, Jpn. Appl. Phys. vol. 33 month unavailable) (1994) pp. L 1070–L 1072 Part 2, No. 8A.

Cole, Jr. et al., Novel Failure Analysis Techniques Using Photon Probing With a Scanning Optical Microscope, (month unavailable) 1994 IEEE/IRPS, Albuquerque, New Mexico.

Lasertic U.S.A., Inc., OBIC Overview, (no month) Pre–1996, Lasertec U.S.A.,INC.

Brochure describing JEOL, Digital OBIC Scanners (JDLM–6600E Series), (no month) pre–1996.

*Primary Examiner*—Ernest Karlsen
*Attorney, Agent, or Firm*—Beyer Weaver & Thomas, LLP

[57] ABSTRACT

Disclosed is a failure analysis tool including a production tester electrically coupled to a test IC in such a manner that it can test the IC in a conventional manner (e.g. by providing a series of dynamic vectors), and also provide an OBIC signal to an OBIC detection system. This is accomplished by providing power to the IC through a voltage source having a non-zero internal resistance while the OBIC signal is generated, thus preventing the OBIC signal from shorting to ground when it is received at the power supply. Failure analysis is conducted by first performing functional testing with a production tester until a failing state is identified. While this functional testing is being performed, the internal resistance of the voltage source is set to zero. Then, when the failing state is identified, the internal resistance of the voltage source is set to a non-zero value and the IC is scanned by an optical beam to generate OBIC signals indicating the locus of the failure.

18 Claims, 2 Drawing Sheets

FUNCTIONAL OBIC ANALYSIS

This is a divisional of U.S. Pat. application Ser. No. 08/701,476, filed on Aug. 22, 1996, now U.S. Pat. No. 5,905,381.

BACKGROUND OF THE INVENTION

The present invention relates generally to methods and apparatus for conducting failure analysis in integrated circuits. More specifically, the invention relates to methods and apparatus for using Optical Beam Induced Current to analyze failure modes discovered with a functional tester.

Integrated circuits ("ICs") must be subjected to failure analysis during development, manufacturing, and after failure in the field. In failure analysis, an IC is subjected to various electronic tests to determine whether an expected electronic result is obtained for each test. This may involve applying a defined set of inputs to input pads of a test IC and monitoring the signals at output pads of the IC. If the monitored set of signals at the output pads does not match an expected set of values, then the IC has in some way failed.

To perform a detailed analysis of an IC's circuitry, a set of "vectors" may be provided to the IC input pads. Each vector is a time varying sequence of input values provided to the input pads of the test IC. By providing a time varying set of input values (a vector), the internal circuitry of the IC may be probed. And by providing a series of such vectors, various possible failure modes throughout the IC may be investigated.

Testing an IC with a set of vectors is commonly referred to as "functional testing" and the apparatus employed to perform functional testing is called a "production tester" or a "functional tester". Such production testers include at least a clock, a series of input connectors for connecting to the IC input pads, a series of output connectors for connecting to the IC output pads, Vdd and Vss inputs, and a controller for generating the vector signals applied to the input pads. To provide thorough testing of an IC, the production tester should have as many input and output connectors as input and output pads on the IC. Thus in 1996 technology, it is not uncommon for a production tester to have more than 500 input and output connectors.

While production testers can determine which vectors elicit failures in an IC, often they can not pin-point the source of the failure within the IC circuitry. They simply identify that a dynamic set of electronic inputs has, at some cycle, exhibited an unintended output. That unintended output may be the result of a short between two devices, a faulty connection to a device, a failed device, etc. The exact device or circuit causing the failure and the structural nature of the failure can not be ascertained with production tester alone. Therefore, IC developers and manufacturers have deployed various probe techniques for pin-pointing IC structures causing failures.

Electron beam probes have been used to generate SEM-like images of an IC. While these images can locate gross structural defects in an IC, they can not easily determine whether current flows between two elements of an IC circuit. Further, electron beam probing must be performed in a vacuum system. Thus, the experimental apparatus and protocol is quite expensive.

Emission microscopy has been employed to image current flow in an operating IC. Emission microscopy employs a radiation detector to identify locations on an IC where radiation is emitted as a result of flowing current. This technique relies on the physical principle that current flowing within an IC will emit some small amount of radiation and that the origin of that radiation can be resolved by microscopy. While this technique can determine the locus of some IC defects by identifying current paths, it is relatively insensitive; only very low intensity radiation is generated by the very low currents flowing in an IC powered by Vdd. Typically, emission microscopy can detect currents no smaller than nanoampere range currents. Further, the technique relies upon currents induced by tester signals provided to signal input pads of an IC in conjunction with the power provided to the cell during normal operation. Thus, it may be difficult to identify latent defects which will manifest themselves only after substantial use.

Optical Beam Induced Current ("OBIC") techniques also locate current flow in an IC, but are more sensitive than emission microscopy techniques. Further, since the physical principles underlying OBIC and emission microscopy are different, OBIC can be used to find different failure modes than those located by emission microscopy. An OBIC is induced upon application of a light beam to a p-n junction in a semiconductor device. The induced current may be collected through Vdd pins. When a current is detected, it is known that the current has been induced at the location where the light beam is currently focused. The OBIC technique is described in various sources. See for example, H. Komoda et al., "Detection of Open Contact Using Optical-Beam-Induced Current Techniques" Jpn. J. Appl. Phys., Vol. 33, pp. L1070–L1072 (1994). Briefly, the technique works as follows. When an optical beam is projected onto a depletion layer (as near a p-n junction), a conduction electron-hole pair is generated in the depletion layer. If the electric field in the depletion region is sufficiently great, the electron and hole will drift in opposite directions without recombining. Thus, the electron and hole will flow out of the junction resulting in an OBIC signal.

OBIC techniques have been employed with static testers to detect IC defects. Such testers employ a power supply such as constant current source and may rely upon a single set of inputs to a small group of IC pads (provided by, for example, a switch box). They have no clock or other functionality for generating a dynamic series of inputs. Thus, they can not generate one or more complicated vectors such as are produced by a production tester. While static testers can, in conjunction with OBIC techniques, locate some IC defects (usually by chance in a complicated IC), they are limited to simple failure modes such as those that might appear in peripheral circuits of an IC (e.g., I/O slot circuits). OBIC testers employing a constant current source are described in U.S. Pat. No. 5,430,305 issued to Cole Jr. et al. and in a related article by Cole Jr. et al., "Novel Failure Analysis Techniques Using Photon Probing With a Scanning Optical Microscope" IEEE/IRPS, pp. 388–398 (1994).

U.S. Pat. No. 5,453,994 issued to Kawamoto et al. describes an OBIC test system in which an IC is subjected to a series of inputs from a clock controlled tester. At each clock cycle, the IC output pads are monitored for an expected result. Also at each cycle, an optical beam from an OBIC test apparatus is directed to a specific drain location on the IC. The locations the optical beam are chosen to test specific drain regions at specific cycles. If the signals on the output pads depart from the expected values at any cycle, it is assumed that the drain currently subjected to optical probing has a defect.

While the technique described in U.S. Pat. No. 5,453,994 probes individual devices with the sensitive OBIC technique, it is limited to testing know devices at specified cycles. If a vector introduces a failure at some location other than the device currently being probed, the locus of the failure is unknown. Further, the technique requires specially designed tester. The operation of the tester has to be sequencialized with the OBIC beam. Thus, the tester will be more complicated and more expensive than an existing production tester. In fact, no currently available tester type can be used with this method.

As yet, there is no technique for forcing an IC into a failing state—as with a production tester—and performing OBIC to determine a failing site. This is due at least in part to the problem of obtaining an OBIC signal when a test IC is coupled to a production tester. Specifically, if a tester is connected to the IC, the tester will short the OBIC signal coming from the device's Vdd pin(s) by shunting the signal to ground (Vss) when the Vdd and Vss contacts are connected to a power supply as it is in a production tester.

Thus, there is a need for an OBIC detection system that can take advantage of a sophisticated testing procedure which will force a test IC to show its failure state.

SUMMARY OF THE INVENTION

The present invention provides a failure analysis system including a production tester electrically coupled to a test IC in such a manner that it can test the IC in a conventional manner (e.g. by providing a series of dynamic vectors), and also provide an OBIC signal to an OBIC detection system. The system accomplishes this by providing power to the IC through a voltage source having a non-zero internal resistance while the OBIC signal is generated, thus preventing the OBIC signal from shorting to ground when it is received at the power supply.

Failure analysis is conducted by first performing functional testing with a production tester until a failing state is identified. Then, the test sequence is set to stop at the failing vector (or any designated vector). While this functional testing is being performed, the internal resistance of the voltage source is set to zero so that Vdd remains constant during the test. Then, when the failing state is identified and the tester is set to stand at the failing vector, the internal resistance of the voltage source is set to a non-zero value (while maintaining the voltage to the IC at Vdd) and the IC is scanned by an optical beam to generate OBIC signals indicating the locus of the failure.

The apparatus of the present invention may be characterized as including the following elements: (a) an OBIC system including (i) a radiation source configured to produce radiation which, when directed onto the integrated circuit, generates mobile charge carriers, and (ii) a controller configured to direct the radiation onto predefined regions of the integrated circuit; (b) a functional tester electronically coupled to multiple pins, other than a power pin, of the integrated circuit and being configured to provide time varying test signals to the multiple pins; and (c) an interface coupled to the power pin of the integrated circuit and coupled to the OBIC system such that the interface provides a controlled voltage level to the power pin of the integrated circuit while the functional tester is controlling the input to the multiple pins and while allowing an OBIC signal to be provided from the integrated circuit to the OBIC system. As noted, an OBIC signal is generated by a current of mobile charge carriers induced in the integrated circuit by the radiation.

Preferably, the interface operates in at least (i) a first state in which a voltage supply of the interface provides the controlled voltage level with no internal resistance, and (ii) a second state in which the voltage supply provides the controlled voltage with a non-zero internal resistance. Typically, the interface will operate in the second state when providing the OBIC signal from the integrated circuit to the OBIC system. An interface providing the first and second states may include an adjustable voltage source and an adjustable resistor, in which the adjustable resistor is set to zero resistance when the interface operates in the first state, but is adjusted to a non-zero resistance in the second state. The interface itself may either form part of the functional tester or be provided external to the functional tester.

The functional OBIC method of this invention may be characterized as including the following steps: (a) performing functional testing on the integrated circuit by providing time varying test signals to multiple pins of the integrated circuit, at least some of which provide signals other than power or ground; (b) directing laser radiation from an OBIC system onto defined locations of the integrated circuit such that the laser radiation generates mobile charge carriers in the integrated circuit; and (c) detecting an OBIC signal caused by a current of the mobile charge carriers in the integrated circuit.

Preferably, the step of directing laser radiation from an OBIC system onto defined locations of the integrated circuit is deferred until after the step of functional testing identifies a failure mode of the integrated circuit. The tester is then set to stop at a designated test vector (often the vector at which failure was detected). Further, the step of performing functional testing preferably is conducted by first providing a series of vectors to the test IC while a voltage source operating at zero internal resistance provides power to a Vdd input of the integrated circuit. Later, when a vector uncovers a failure mode, the voltage source is operated at a non-zero internal resistance such that OBIC signals from the integrated circuit reach the OBIC system.

These and other features and advantages of the invention will be described in more detail below with reference to the drawings.

DETAILED DESCRIPTION OF THE PREFERRED EMBODIMENTS

The present invention integrates an OBIC system with a production tester to allow functional testing to elicit failure modes that may be probed by OBIC. An OBIC system will cause current to flow from a p-n junction, into the semiconductor substrate, and ultimately to ground. Thus, the OBIC signal may be monitored at the lines providing power and ground the IC being tested. In general, the invention can be practiced with any optical system capable of generating and detecting OBIC signals in an electronic device.

The functional tester coupled to the OBIC system generates a series of vectors, each of which provides a time-varying sequence of pin signals to the multiple pins. The vectors are provided to force the device into any failure mode it may possess. In general, functional testers suitable for use with the present invention may be any of the standard production tester used in the device testing field. Such testers will include a clock and appropriate controller for generating vectors, providing signals to IC input pins, and monitoring signals at IC output pins.

Figure 1:
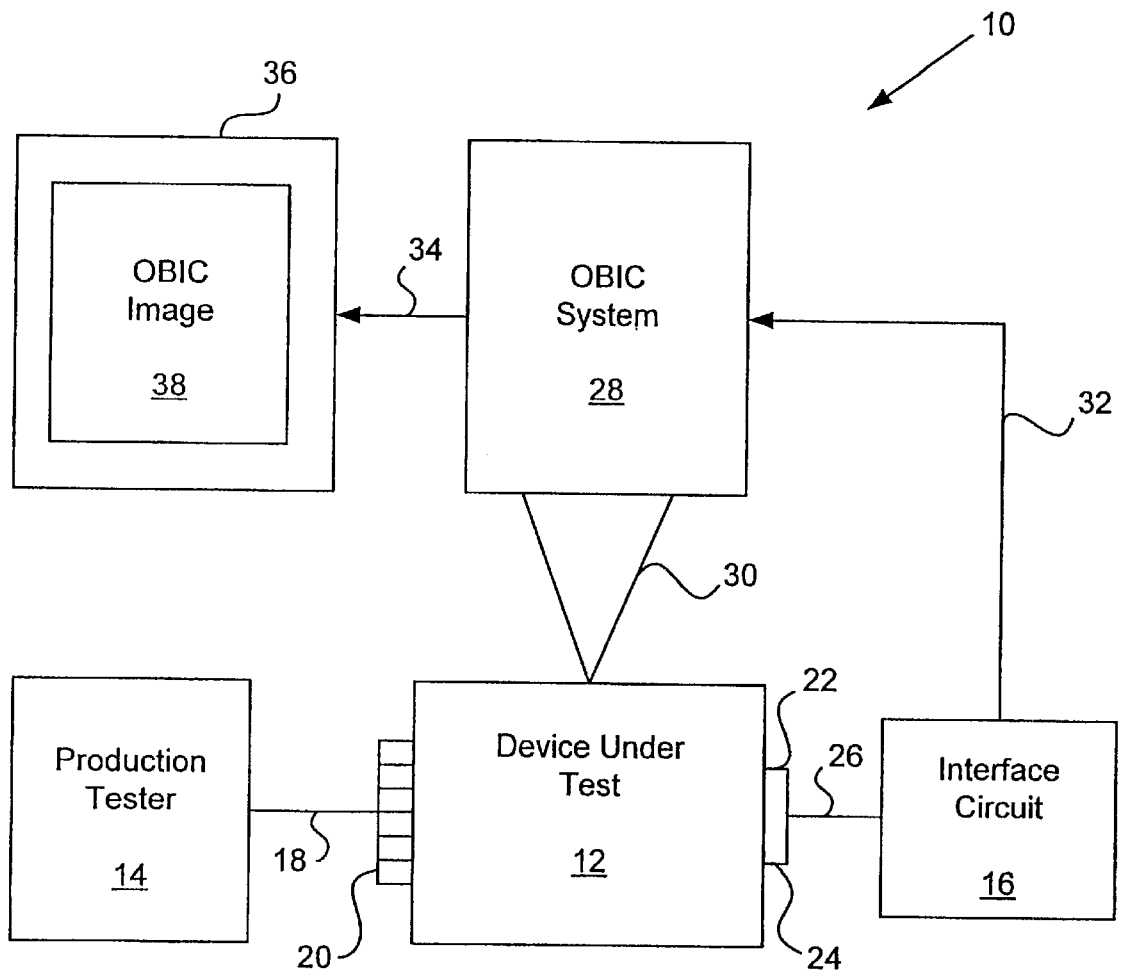
FIG. 1 is block diagram of an OBIC production tester system in accordance with one embodiment of the present invention.

FIG. 1 presents in OBIC-production tester system 10 in accordance with one embodiment of the present invention. As shown, system 10 includes a device under test 12 (such as an integrated circuit) electronically coupled to a production tester 14 and an interface circuit 16. Production tester 14 includes an interface cable 18 and specialized boards for providing numerous vectors to a plurality of pins 20 on test device 12. Tester 14 is coupled to the output as well as input pins 20 of device 12. In this manner, the output pins are monitored for signals indicating a failure. Preferably, though not necessarily, pins 20 include all pins available on test device 12 except for the Vdd power pin(s). Basically, the arrangement of production tester 10 and test device 12 is that used in conventional functional testing, with the exception that the production tester does not control the power pin(s).

That task is left for interface circuit 16 which provides power to a Vdd pin 22 and ground to a Vss pin 24 through a cable 26. As will be explained in more detail below, interface circuit 16 accomplishes this task in two distinct modes of operation. In the first mode, power and ground are provided without provision for outputting an OBIC signal. In the second mode, an OBIC signal may be output from interface circuit 16 at the same time it is providing power and ground to test device 12.

In the case where the device under test has multiple groups of Vdd pins, it will be preferable to use the method of this invention with only one such group of Vdd pins. Thus, one group of Vdd pins is connected to the interface circuit and the remaining groups of Vdd pins are connected to the tester.

Suitable functional testers for use with this invention may be obtained from various sources. One suitable functional tester is the Model LT1101 available from Credence Systems Corporation of Milpitas California.

An OBIC system 28 generates an optical beam 30 which can be directed onto defined locations of test device 12 through a controller in OBIC system 28. Preferably, the OBIC system 28 scans the entire active area of test device 12 by moving optical beam 30 across the test device surface in rasterized fashion. Of course, in some embodiments, it may be preferable to scan only a portion of the IC active area where problems are most likely to occur.

Any current induced in device 12 as a result of mobile carrier generation inside the device by beam 30 will flow to Vdd pin(s) 22 where it can be transmitted by interface circuit 16 to OBIC system 28 via a cable 32. Note that OBIC system 28 typically includes an amplifier (not shown) for amplifying the OBIC signal. OBIC system 28 uses the OBIC signal provided over cable 32 together with information about the current location of beam 30 on device 12 to generate an OBIC image 38 on an OBIC image output device 36. Image 38 will show beam induced current as a function of location in device 12. Output device 36 may be a monitor such as a CRT screen, an LCD screen, or the like. It may also be a simple printer or similar device for outputting a paper copy of image 38. It may also be a data storage device for storing image data of the OBIC signal. A suitable OBIC system is a laser scanning microscope available from Carl Zeiss Company of New York.

Figure 2:
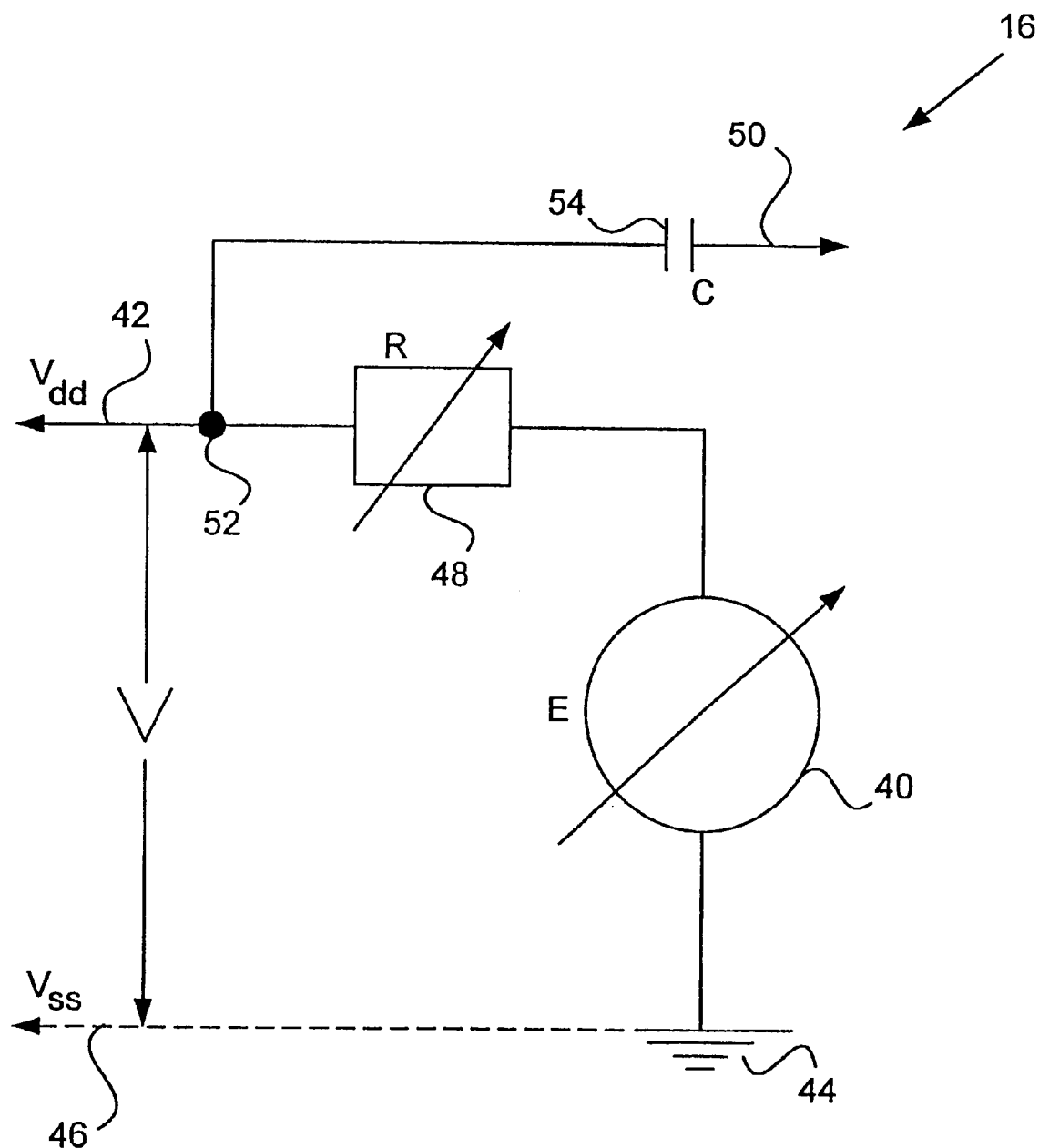
FIG. 2 is block diagram of an interface circuit employed to provide power to a device under test and to provide OBIC signals from such device to an OBIC system in accordance with one embodiment of the present invention.

FIG. 2 is a schematic drawing of interface circuit 16 in accordance with a preferred embodiment of the present invention. Circuit 16 includes an adjustable voltage source 40 which supplies a specified voltage Vdd to test device 12 through a line 42. Adjustable voltage source 40 is also coupled to ground 44. A dashed line 46 to Vss on device 12 is also coupled to ground 44. The voltage applied to device 12 by adjustable voltage source 40 (i.e., the difference between Vdd at line 42 and Vss at line 46) may be monitored by a potentiometer (not shown).

Interface circuit 16 also includes an adjustable resistor 48 electrically coupled to adjustable voltage source 40 and located between source 40 and Vdd line 42. During normal functional testing, adjustable resistor 48 is preferably set to a value of zero resistance. This allows the current to device 12 to vary according to the IC load at any given cycle while maintaining a constant voltage to the device's power pins. Note however that when the interface is operating in this zero internal resistance mode, any OBIC signal on power line 42 is simply shorted to ground. Thus during normal functional testing, OBIC signals will typically not be registered. In fact, in preferred embodiments, the OBIC system 28 remains quiescent during functional testing.

When adjustable resistor 48 is set to a non-zero value, then the value of an OBIC signal can be detected at a node 52 located on Vdd line 42 between test device 12 and adjustable resistor 48. Thus, to allow for transmission of any OBIC signal to the OBIC system 28, resistor 48 is set to a non-zero value. Node 52 is connected to an OBIC signal line 50 which leads to OBIC system 28. Because, the OBIC signal is an AC signal, it is coupled through a capacitor 54 onto line 50 such that no DC current from the power supply 40 can pass through the capacitor 54 to line 50.

A preferred method of failure analysis will now be described. Initially, the device under test is installed in a test apparatus. This requires exposing the device active surface. If necessary, part of the device packaging is stripped away to allow the optical beam to have access to the device active surface. After the test device is properly installed, the system is placed in a first mode.

As noted, interface 16 preferably operates in two modes. In the first mode, the resistance of adjustable resistor 48 is set to zero. In this mode, no OBIC signal can be transmitted over line 50, as any such signal would be shorted to ground 44. Thus, system 10 is operated in this first mode without utilizing OBIC system 28. However, while in the first mode, production tester 14 is used to generate a series of vectors to force device 12 to show any failure modes that it may harbor. Production tester 14 provides signals to as many input pins as is suitable for the test. However, it does not provide power through the Vdd pin(s). This role is reserved for interface circuit 16. The value of Vdd can, of course, be precisely controlled by adjustable voltage source 40 during this phase of the testing. Thus, voltage source 40 may be set to 5.0 volts for some devices, 3.3 volts for other devices, etc., depending upon the design Vdd for the particular device under test.

During operation in the first mode, the production tester 14 monitors the output pins of device 12. If at any cycle, the output pins do not provide the expected signal, a failure mode is detected. Then the tester 14 registers such failure according to its normal operation and stops at this failing vector to keep the device at its failing state for OBIC testing. To do so, tester 14 stops its sequence at the failing vector (which is not necessarily the first failure) so that each pin keeps the value specified by the current vector to maintain the device in the failing state through the entire OBIC analysis. However, before such OBIC analysis can occur, the interface circuit 16 must be placed in a second mode which allows the OBIC signal to be transmitted over line 32 to OBIC system 28. To this end, adjustable resistor 48 is adjusted to a non-zero value of resistance. This allows some of the signal on Vdd line 42 to be coupled through capacitor 54 to OBIC signal line 50. In practice, once the device is forced into its failing state, the resistance at resistor 48 and the voltage at voltage source 40 are gradually increased to designated values (either simultaneously or one after the other). These adjustments are made by small increments so that the voltage across the test device 12 remains unchanged or little changed during the process, thereby maintaining the device's failure state essentially unchanged. Of course, this adjustment process can be automated by providing the interface circuit 16 with a control IC for this purpose.

After the resistor 48 and the voltage source 40 are adjusted to appropriate values in mode 2 as specified above, OBIC analysis is performed to locate the site of a failure. The optical beam 30 is focused on a specific region of device 12, and then raster scanned over the all or some fraction of the device surface. All the while, interface circuit 16 allows the OBIC signal to pass through to OBIC system 28, where it is used to image induced current in the device. From this image, the site of the failure may be located. Specifically, if a "hot spot" (i.e., a region of high current) is imaged at a location where no such current is expected, then the failure spot has been located.

Not only can the OBIC analysis detect the locus of a failure in a test device, it may also detect latent defects that might cause the IC to fail much later in its life. This is possible because the optical beam used in OBIC can force current to flow through latent defects such as abnormally thin dielectric regions which would provide adequate insulation for a short period.

To recap, functional testing may be conducted in two stages. In the first stage, production tester 14 supplies a series of vectors to test device 12 while interface circuit 16 supplies a designed voltage to test device 12 through a circuit having zero internal resistance. Then, in a second stage, after a failure mode has been set by the tester, the internal resistance of interface circuit 16 is gradually increased while maintaining the same voltage to test device 12. Also in this second stage, OBIC system 28 scans optical beam 30 over test device 12. The rasterized OBIC signal is fed back to OBIC system 28 where it is used to generate OBIC image 38. This image will, of course, show where optically induced currents flow through test device 12 while that test device is in its failure mode. In this manner, the IC structure causing the failure can be located with pin point accuracy.

Although a few specific embodiments of the present invention have been described in detail, it should be understood that the present invention may be embodied in many other specific forms without departing from the spirit or scope of the invention as recited in the claims. For example, while the system of this invention has been described as performing functional testing with OBIC analysis, the system may be designed to operate in either static or functional mode. In static mode, the production tester would simply be decoupled from the device under test. Then, the interface would supply Vdd for testing in static mode.

What is claimed is:

1. An apparatus for performing functional analysis of an integrated circuit, the apparatus comprising:
   (a) an OBIC system including
      (i) a radiation source configured to produce radiation which, when directed onto said integrated circuit, generates mobile charge carriers, and
      (ii) a controller configured to direct said radiation onto predefined regions of said integrated circuit;
   (b) a functional tester electronically coupled to multiple pins, other than a power pin, of the integrated circuit and being configured to provide time varying test signals to said multiple pins; and
   (c) an interface coupled to said power pin of the integrated circuit and coupled to said OBIC system such that said interface provides a controlled voltage level to the power pin of said integrated circuit while said functional tester is controlling the input to said multiple pins and while allowing an OBIC signal to be provided from the integrated circuit to said OBIC system, wherein said OBIC signal is caused by a current of said mobile charge carriers induced in the integrated circuit by said radiation.

2. The apparatus of claim 1, further comprising an amplifier coupled to said interface to receive and amplify said OBIC signal, wherein said amplifier is also coupled to said OBIC system.

3. The apparatus of claim 2, wherein said OBIC system further includes an image output device which produces an image of the integrated circuit and showing locations on the integrated circuit where said current is flowing.

4. The apparatus of claim 3, wherein the image output device is a monitor for displaying said image.

5. The apparatus of claim 1, wherein the functional tester generates a series of vectors, each of which provides a time-varying sequence of pin signals to said multiple pins to define a failure test.

6. The apparatus of claim 1, wherein said interface operates in at least (i) a first state in which a voltage supply of the interface provides said controlled voltage level with no internal resistance, and (ii) a second state in which the voltage supply provides said controlled voltage with a non-zero internal resistance, and wherein the interface operates in the second state when providing the OBIC signal from the integrated circuit to the OBIC system.

7. The apparatus of claim 6, wherein said the voltage supply includes an adjustable voltage source and an adjustable resistor, and wherein the adjustable resistor is set to zero resistance when the interface operates in the first state.

8. The apparatus of claim 6, wherein the power supply is provided external to said functional tester.

9. The apparatus of claim 6, wherein the power supply forms part of the functional tester.

10. An apparatus for performing functional analysis of an integrated circuit, the apparatus comprising:
    (a) OBIC system means including
       (i) radiation source means for producing an optical beam which, when directed onto said integrated circuit, generates mobile charge carriers, and
       (ii) controller means for directing said laser radiation onto predefined regions of said integrated circuit;
    (b) functional tester means configured to provide time varying test signals on multiple pins of said integrated circuit, at least some of said pins providing signals other than power or ground; and
    (c) interface means for providing a controlled voltage level to a power input of said integrated circuit while said functional tester is controlling the input to said multiple pins and while allowing an OBIC signal to be provided from the integrated circuit to said OBIC system means, wherein said OBIC signal is caused by a current of said mobile charge carriers induced in the integrated circuit by the optical beam.

11. The apparatus of claim 10, further comprising amplifier means coupled to said interface means such that it can receive and amplify said OBIC signal before providing said signal to an OBIC system means.

12. The apparatus of claim 11, wherein said OBIC system means further includes means for imaging the integrated circuit and showing locations on the integrated circuit where said current is flowing.

13. The apparatus of claim 12, wherein the means for imaging is a monitor means for displaying an image of said integrated circuit.

14. The apparatus of claim 10, wherein the functional tester means generates a series of vectors, each of which provides a time-varying sequence of pin signals to said multiple pins to define a failure test.

15. The apparatus of claim 10, wherein said interface means operates in at least (i) a first state in which a voltage supply means of the interface means provides said controlled voltage level with no internal resistance, and (ii) a second state in which the voltage supply means provides said controlled voltage with a non-zero internal resistance, and wherein the interface operates in the second state when providing the OBIC signal from the integrated circuit to the OBIC system means.

16. The apparatus of claim 15, wherein said the voltage supply means includes means for adjusting a voltage output by said voltage supply means and means for adjusting the resistance of a resistor, and wherein the resistor is adjusted to zero resistance when the interface means operates in the first state.

17. The apparatus of claim 15, wherein the power supply means is provided external to said functional tester means.

18. The apparatus of claim 15, wherein the power supply means forms part of the functional tester means.

* * * * *